United States Patent
Chung et al.

(10) Patent No.: US 6,693,842 B2
(45) Date of Patent: Feb. 17, 2004

(54) SEMICONDUCTOR DEVICE HAVING A PLURALITY OF OUTPUT SIGNALS

(75) Inventors: Hoe-ju Chung, Suwon (KR); Kyu-hyoun Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/108,671

(22) Filed: Mar. 28, 2002

(65) Prior Publication Data

US 2002/0186595 A1 Dec. 12, 2002

(30) Foreign Application Priority Data

Jun. 7, 2001 (KR) ........................... 2001-31698

(51) Int. Cl.[7] .................................. G11C 8/00
(52) U.S. Cl. ............ 365/230.06; 365/194; 365/230.05; 365/230.08; 365/226; 365/227; 327/108
(58) Field of Search ................. 365/201, 194, 365/230.06, 230.05, 230.08, 226, 227; 327/108

(56) References Cited

U.S. PATENT DOCUMENTS

| | | | | |
|---|---|---|---|---|
| 6,081,915 A | * | 6/2000 | Kalluri et al. ............... 714/724 |
| 6,255,867 B1 | * | 7/2001 | Chen ........................... 327/108 |
| 6,262,606 B1 | * | 7/2001 | Tamjidi ....................... 327/108 |
| 6,380,797 B1 | * | 4/2002 | Macaluso et al. ............ 327/513 |
| 6,388,935 B1 | * | 5/2002 | Kawagoe et al. ......... 365/225.7 |
| 6,445,224 B1 | * | 9/2002 | Fong ........................... 327/108 |

FOREIGN PATENT DOCUMENTS

KR 11225062 8/1999

OTHER PUBLICATIONS

English Abstract.

* cited by examiner

*Primary Examiner*—Richard Elms
*Assistant Examiner*—Toan Le
(74) *Attorney, Agent, or Firm*—F. Chau & Associates, LLC

(57) ABSTRACT

A semiconductor device having a plurality of output signals is provided. The semiconductor device includes a plurality of PMOS transistors each having a drain of connected to a predetermined node and a source supplied with a first power voltage. A plurality of first buffers are connected to the gates of the plurality of PMOS transistors. A plurality of NMOS transistors each have a drain connected to the predetermined node, and a source supplied with a first ground voltage. A plurality of second buffers are connected to gates of the NMOS transistors. The plurality of first buffers are supplied with the first ground voltage, the plurality of second buffers are supplied with the first power voltage, and a signal output from a previous portion of the semiconductor device is input into the first and second buffers at predetermined time intervals. As a result, skewing of the output signals is reduced.

17 Claims, 7 Drawing Sheets

SEMICONDUCTOR DEVICE HAVING A PLURALITY OF OUTPUT SIGNALS

BACKGROUND OF THE INVENTION

1. Field of the Invention

The present invention generally relates to a semiconductor device, and more particularly, to a semiconductor device having a plurality of output signals.

2. Description of the Related Art

A semiconductor memory device stores data, and the stored data is output in response to a predetermined signal. As the memory capacity of semiconductor memory devices increase, the amount of data that is input and output also increases.

FIG. 1 is a circuit diagram of an output portion of a conventional semiconductor memory device having a plurality of output signals. An output portion 111 includes a plurality of output drivers DR1 through DRn. The output drivers DR1 through DRn buffer signals DI1 through DIn output from within a semiconductor memory device and output signals DQ1 through DQn. The output signals DQ1 through DQn are transmitted outside the semiconductor memory device. Each of the output drivers DR1 through DRn generally has both an NMOS transistor and a PMOS transistor. The NMOS transistors and the PMOS transistors switch the signals DI1 through DIn from logic "low" to logic "high" or from logic "high" to logic "low". A large amount of current flows from an output node of the output portion 111 to a power line 121 or a ground line 131 during the switching operation if the input signals DI1 through Din are input into the output portion 111 at the same time. Here, switching noise is present in the output signals DQ1 through DQn due to parasitic inductance components existing in the power line 121 or the ground line 131. As a result, the output signals DQ1 through DQn are delayed or distorted. The switching noise increases in proportion to the amount of current per time. In other words, the greater current, the greater the switching noise.

The switching noise does not matter much if a small number of signals are output from the output portion 111 at the same time. However, if a large number of signals are output from the output portion 111 at the same time, in particular, if the number of output signals switched in one direction is not equal to the number of output signals switched in an opposite direction, skewing of the output signals occurs due to simultaneous switching noise. The reason is that gate voltages of the NMOS transistors and the PMOS transistors change due to fluctuations in power voltage or ground voltage. Skewing of the output signals increases when the number of output signals DQ1 through DQn of the semiconductor memory device increases, the number of parasitic inductance components increases, and when the semiconductor memory device is in a high-speed operation.

FIGS. 2A, 2B, and 2C are diagrams illustrating waveforms of 16 signals output at the same time from the output portion 111 shown in FIG. 1.

FIG. 2A illustrates the waveform diagrams of the output signals DQ1 through DQ16 when the number of output signals (that is output signals DQ1 through DQ8) that simultaneously changed from logic "high" to logic "low" is the same as the number of output signals (i.e., output signals DQ9 through DQ16) that simultaneously changed from logic "low" to logic "high". As described, simultaneous switching noise occurs in the output signals DQ1 through DQ16 if the number of output signals (i.e., output signals DQ1 through DQ8) that simultaneously changed from logic "high" to logic "low" is the same as the number of output signals (i.e., output signals DQ9 through DQ16) that simultaneously changed from logic "low" to logic "high". Thus, skewing of the output signals DQ1 through DQ16 does not occur.

However, as shown in FIG. 2B, skewing $t_1$ occurs when output signals DQ1 through DQ15 are simultaneously changed from logic "high" to logic "low" and output signal DQ16 is changed from logic "low" to logic "high". Alternatively, as shown in FIG. 2C, when the output signals DQ1 through DQ15 are simultaneously changed from logic "low" to logic "high" and the output signal DQ16 is changed from logic "high" to logic "low", skewing $t_2$ occurs.

SUMMARY OF THE INVENTION

To solve the above and other related problems of the prior art, there is provided a semiconductor device that reduces the skewing of signals occurring when a plurality of signals are simultaneously output.

According to an aspect of the present invention, there is provided a semiconductor device including a first pre-driver, a second pre-driver, and an output portion. The first pre-driver operates in response to a first signal. The second pre-driver operates in response to a second signal. The output portion outputs an output signal external to the semiconductor device in response to signals output from the first and second pre-drivers. A first ground line supplies a first ground voltage to the output portion and the first pre-driver and a first power line supplies a first power voltage to the output portion and the second pre-driver.

According to another aspect of the present invention, the semiconductor device further comprises a second power line for supplying a second power voltage. The first pre-driver is supplied with any one of the first power voltage or the second power voltage via the first power line or the second power line, respectively. The first power voltage being different from the second power voltage.

According to yet another aspect of the present invention, the semiconductor device further comprises a second ground line for supplying a second ground voltage. The second pre-driver is supplied with any one of the first ground voltage or the second ground voltage via the first ground line or the second ground line, respectively. The first ground voltage being different from the second ground voltage.

According to yet still another aspect of the present invention, the output portion comprises a PMOS transistor gated by a signal output from the first pre-driver for transmitting the second power voltage to an output node. A PMOS transistor is gated by a signal output from the second pre-driver for transmitting the second ground voltage to the output node. The output signal of the output portion is output from the output node.

According to yet still further another aspect of the present invention, the semiconductor device further includes a decoupling capacitor connected between the first power line and the first ground line to maintain a uniform range of fluctuations in the first power voltage and the first ground voltage during the switching of the output portion.

According to a further aspect of the present invention, there is provided a semiconductor device having a plurality of output portions. Each of the plurality of output portions includes a plurality of PMOS transistors, a plurality of first buffers, a plurality of NMOS transistors, and a plurality of second buffers. Each of the plurality of PMOS transistors has a gate, a drain, and a source. The drain of each of the plurality of PMOS transistors is connected to a predetermined node, and the source of each of the plurality of PMOS transistors is supplied with a first power voltage. Each of the plurality of first buffers being connected to the gate of each of the plurality of PMOS transistors. Each of the plurality of NMOS transistors has a gate, a drain, and a source. The drain of each of the plurality of NMOS transistors is connected to the predetermined node, and the source of each of the plurality of NMOS transistors is supplied with a first ground voltage. Each of the plurality of second buffers is connected to the gate of each of the plurality of NMOS transistors. The plurality of first buffers are supplied with the first ground voltage, the plurality of second buffers are supplied with the first power voltage, and a signal output from a previous portion of the semiconductor device is input into the first and second buffers at predetermined time intervals.

According to a yet further aspect of the present invention, each of the first buffers have a ground terminal connected to a line transmitting the first ground voltage, and each of the second buffers have a power terminal connected to a line transmitting the first power voltage.

According to a still further aspect of the present invention, the plurality of PMOS transistors are first inactivated and then the plurality of NMOS transistors are activated when the signal output from the previous portion of the semiconductor device changes from a logic low level to a logic high level. The plurality of NMOS transistors are first inactivated and then the plurality of PMOS transistors are activated when the signal output from the previous portion of the semiconductor device changes from a logic high level to a logic low level.

According to another further aspect of the present invention, a decoupling capacitor is connected to the line transmitting the power voltage and the line transmitting ground voltage to maintain a uniform range of fluctuations in the power voltage and the ground voltage during the switching of the output portion.

Skewing of the output signals is considerably reduced.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
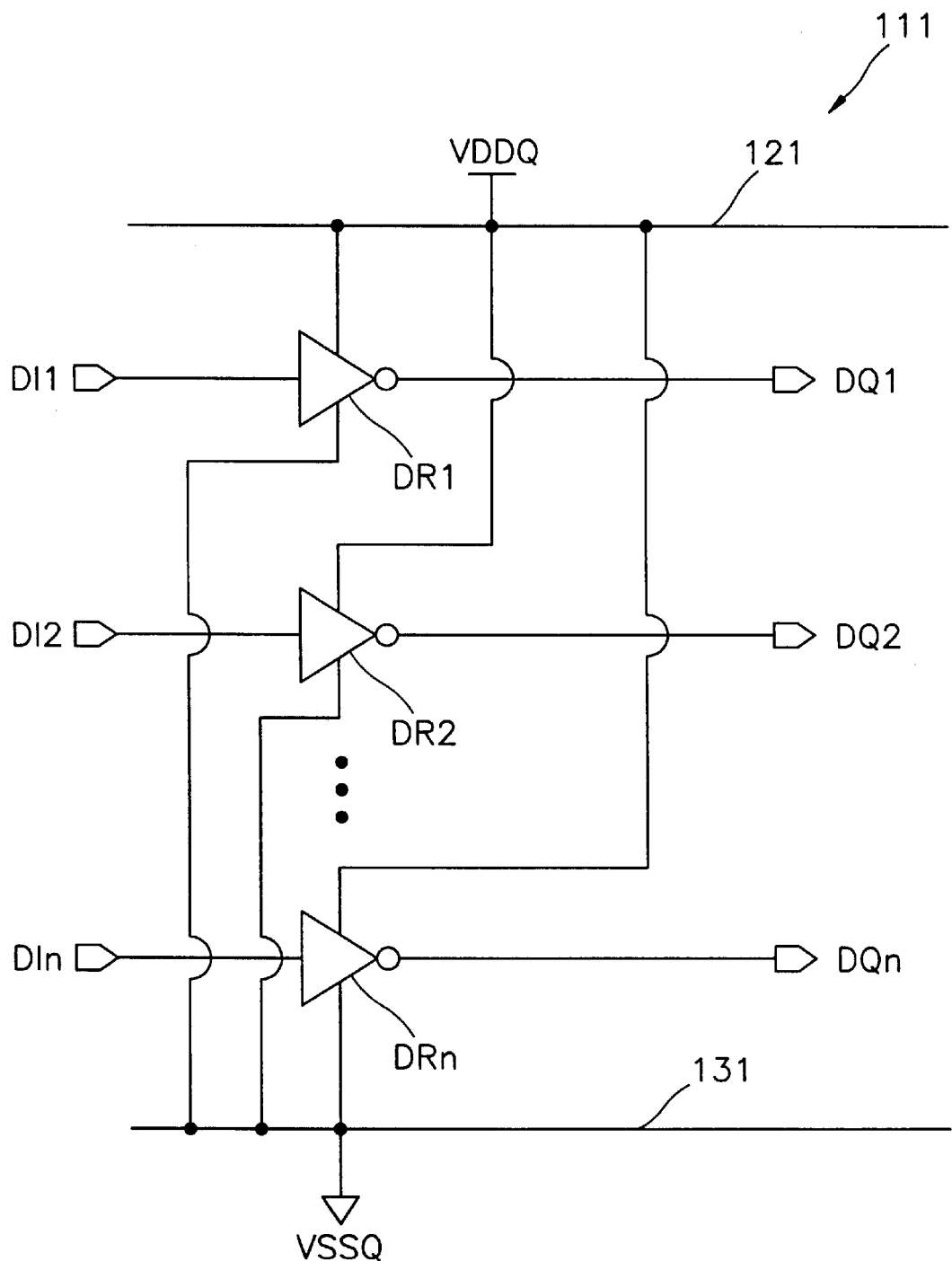
FIG. 1 is a circuit diagram of an output portion of a conventional semiconductor memory device having a plurality of output signals.
Figure 2A:
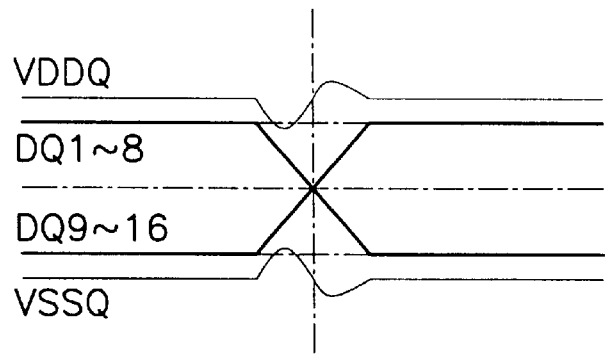
FIGS. 2A, 2B, and 2C are diagrams of waveforms of a plurality of signals output at the same time from an output portion shown in FIG. 1.
Figure 2B:
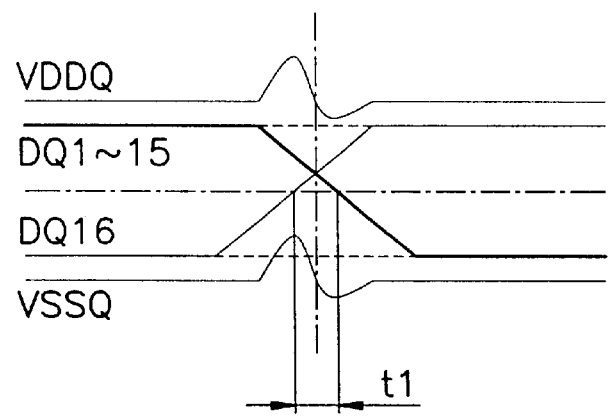
Figure 2C:
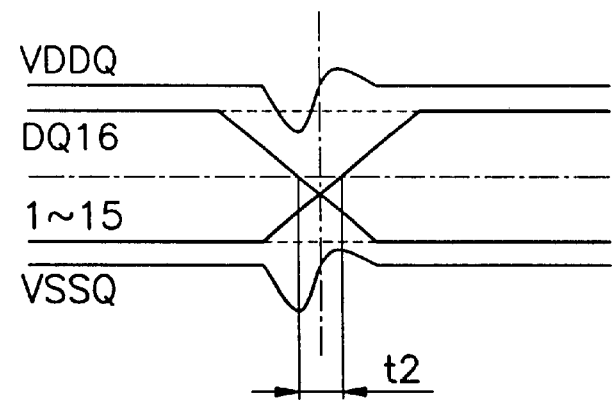

Hereinafter, the present invention will be described in detail by explaining preferred embodiments thereof with reference to the attached Figures. It is to be appreciated that identical reference numerals in the drawings denote the same members.

Figure 3:
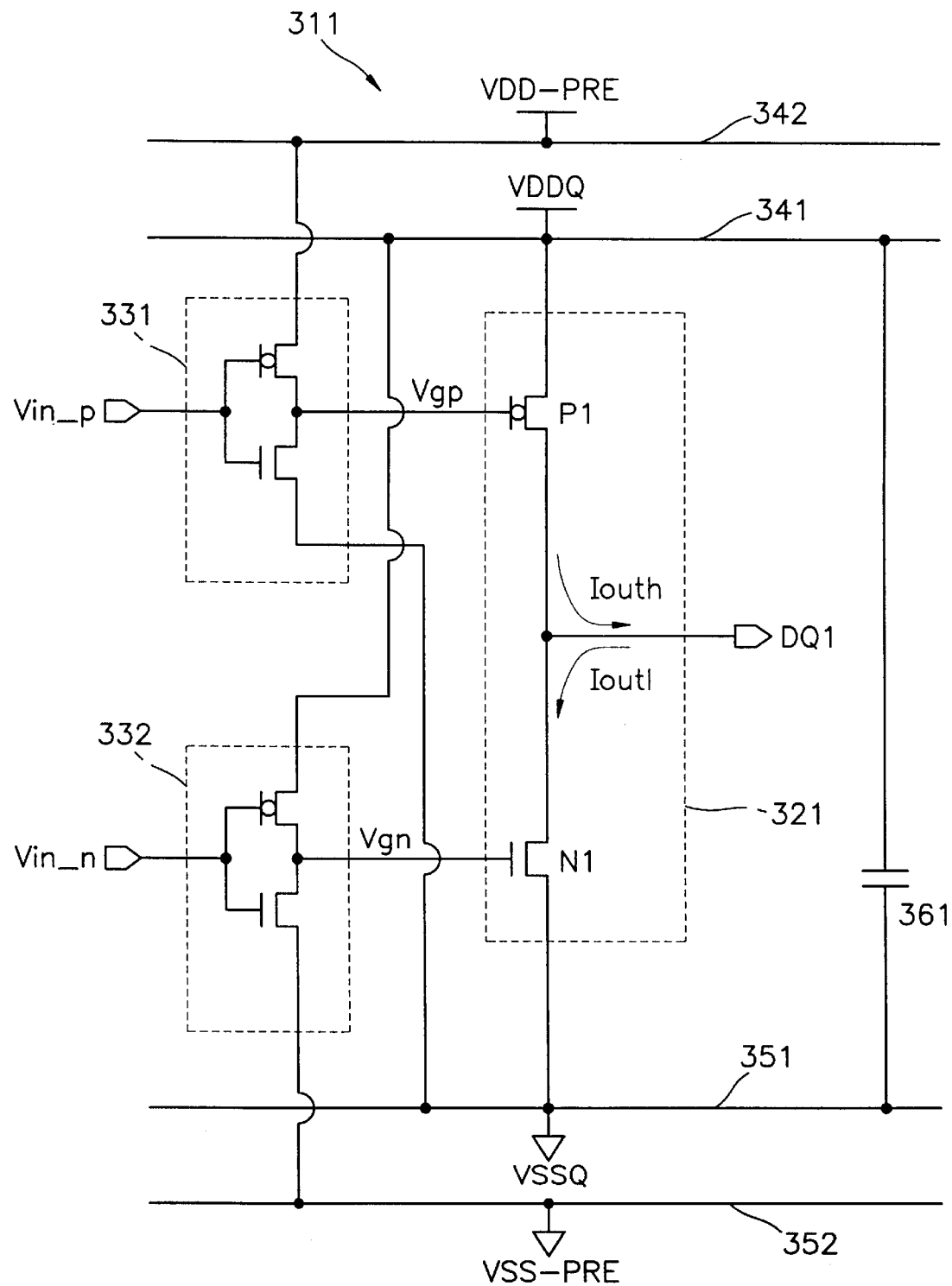
FIG. 3 is a circuit diagram of an output portion of a semiconductor device according to an illustrative embodiment of the present invention.

FIG. 3 is a circuit diagram of an output portion 311 of a semiconductor device, e.g., a semiconductor memory device, according to an illustrative embodiment of the present invention. The output portion 311 includes first and second pre-drivers 331 and 332 and an output driver 321. The output driver 321 includes a PMOS transistor P1 and an NMOS transistor N1, and the first and second pre-drivers 331 and 332 each include an inverter. The first and second pre-drivers 331 and 332 may also include several other circuits.

For descriptive convenience, the output portion 311 of FIG. 3 includes one output driver 321 and two pre-drivers 331 and 332. However, in practice, the output portion 311 may include a plurality of output drivers and a plurality of pre-drivers. Here, the plurality of output drivers are connected to each other in parallel, and the plurality of pre-drivers are connected to each other in parallel. Thus, the output portion 311 may simultaneously output a plurality of signals.

A first power line 341 supplies the output driver 321 with a first power voltage VDDQ, and a second power line 342 supplies the first pre-driver 331 with a second power voltage VDD-PRE. The first pre-driver 331 may be supplied with the first power voltage VDDQ via the first power line 341, which has the same effect as when the first pre-driver 331 is supplied with the second power voltage VDD-PRE via the second power line 342. A first ground line 351 supplies the output driver 321 with a first ground voltage VSSQ, and a second ground line 352 supplies the second pre-driver 332 with a second ground voltage VSS-PRE. The second pre-driver 332 may be supplied with the first ground voltage VSSQ via the first ground line 351, which has the same effect as when the second pre-driver 332 is supplied with the second ground voltage VSS-PRE via the second ground line 351.

The operation of the output portion 311 will now be described, according to an illustrative embodiment of the present invention.

First, when an input signal Vin_n is changed from logic "high" to logic "low", output current Ioutl flowing through the NMOS transistor N1 is represented by equation 1 as follows:

$$Ioutl = fn(Vgn - VSSQ) \quad (1)$$

where Vgn represents a voltage applied to the gate of the NMOS transistor N1. The first ground voltage VSSQ is increased due to simultaneous switching noise when a plurality of input signals are changed from logic "high" to logic "low". The switching rate of the NMOS transistor N1 is slowed down if the voltage Vgn remains constant and the first ground voltage VSSQ is increased. As a result, the transition time for an output signal DQ1 is delayed. In other words, as the switching rate of the NMOS transistor is slowed down, the transition time for the output signal DQ1 becomes significantly delayed. Thus, the voltage Vgn must be increased to reduce the delay of the transition time of the output signal DQ1. Current Ign must be increased to increase the voltage Vgn. Current Ign is represented by equation 2 as follows:

$$Ign=fp(VSSQ-Vin\_n) \qquad (2)$$

Since the second pre-driver 332 is supplied with the second ground voltage VSS-PRE via the second ground line 352, the second ground voltage VSS-PRE increases with an increase in the first ground voltage VSSQ. A decoupling capacitor 361 maintains the uniform range of fluctuation in the first ground voltage VSSQ and the first power voltage VDDQ. The voltage Ign increases with an increase in the first power voltage VDDQ, which results in increasing the rate at which the voltage Vgn rises. An increase in the voltage Vgn increases the switching rate of the NMOS transistor N1. As a result, the transition time for the output signal DQ1 increases.

In other words, the second pre-driver 332 is supplied with a power voltage via the first power line 341, and thus the rate at which the voltage Vgn rises increases, which results in increasing the transition time from logic "high" to logic "low" of the output signal DQ1. That is, the delay time of the output signal DQ1 is reduced when the output signal DQ1 is changed.

The operation of the output portion 311 in changing an input signal Vin_p from logic "low" to logic "high" will now be described, according to an illustrative embodiment of the present invention.

When the input signal Vin_p is logic "high", the PMOS transistor P1 is activated. Thus, output current Iouth flows through the PMOS transistor P1. The output current Iouth is represented by equation 3 as follows:

$$Iouth=fp(VDDQ-Vgp) \qquad (3)$$

where Vgp is a voltage applied to the gate of the PMOS transistor P1. The decoupling capacitor 361 increases the first power voltage VDDQ with an increase in the first ground voltage VSSQ due to simultaneous switching noise. Thus, the output current Iouth increases when the input signal Vin_p is changed from logic "low" to logic "high", which results in increasing the transition time for the output signal DQ1. Large skewing occurs in signals output from the output portion 311 due to the difference in the amount of current between the output current Iouth and the output current Ioul. To reduce the great skews, the output current Iouth must be reduced. The voltage Vgp must be increased to reduce the output current Iouth. Current Igp that determines the voltage Vgp is represented by equation 4 as follows:

$$Igp=fn(Vin\_p-VSSQ) \qquad (4)$$

where VSSQ is a ground voltage supplied to the first pre-driver 331, i.e., the first ground voltage supplied via the first ground line 351. The first ground voltage VSSQ is increased by simultaneous switching noise. Thus, the current Igp decreases, which means that the falling rate of the voltage Vgp decreases. This results in a reduction in the voltage difference between the first power voltage VDDQ and the voltage Vgp supplied to the output driver 321. As a result, the switching rate of the PMOS transistor P1 is slowed down, thereby prolonging the transition time of the output signal DQ1. The supply of the first ground voltage VSSQ from the first ground line 351 to the first pre-driver 331 slows down the switching rate of the PMOS transistor P1. As a result, the time for the transition of the output signal DQ1 from logic "low" to logic "high" becomes longer.

As described above, the supply of the first ground voltage VSSQ from the first ground line 351 to the first pre-driver 331 slows down the transition rate of a small number of output signals from logic "low" to logic "high". The supply of the first power voltage VDDQ from the first power line 341 to the second pre-driver 332 increases the transition rate of a large number of output signals from logic "high" to logic "low". Thus, skewing is reduced for a large number of output signals and a small number of output signals. Likewise, when a small number of output signals are simultaneously changed from logic "high" to logic "low" and a large number of output signals are simultaneously changed from logic "low" to logic "high", skewing is reduced.

Figure 4:
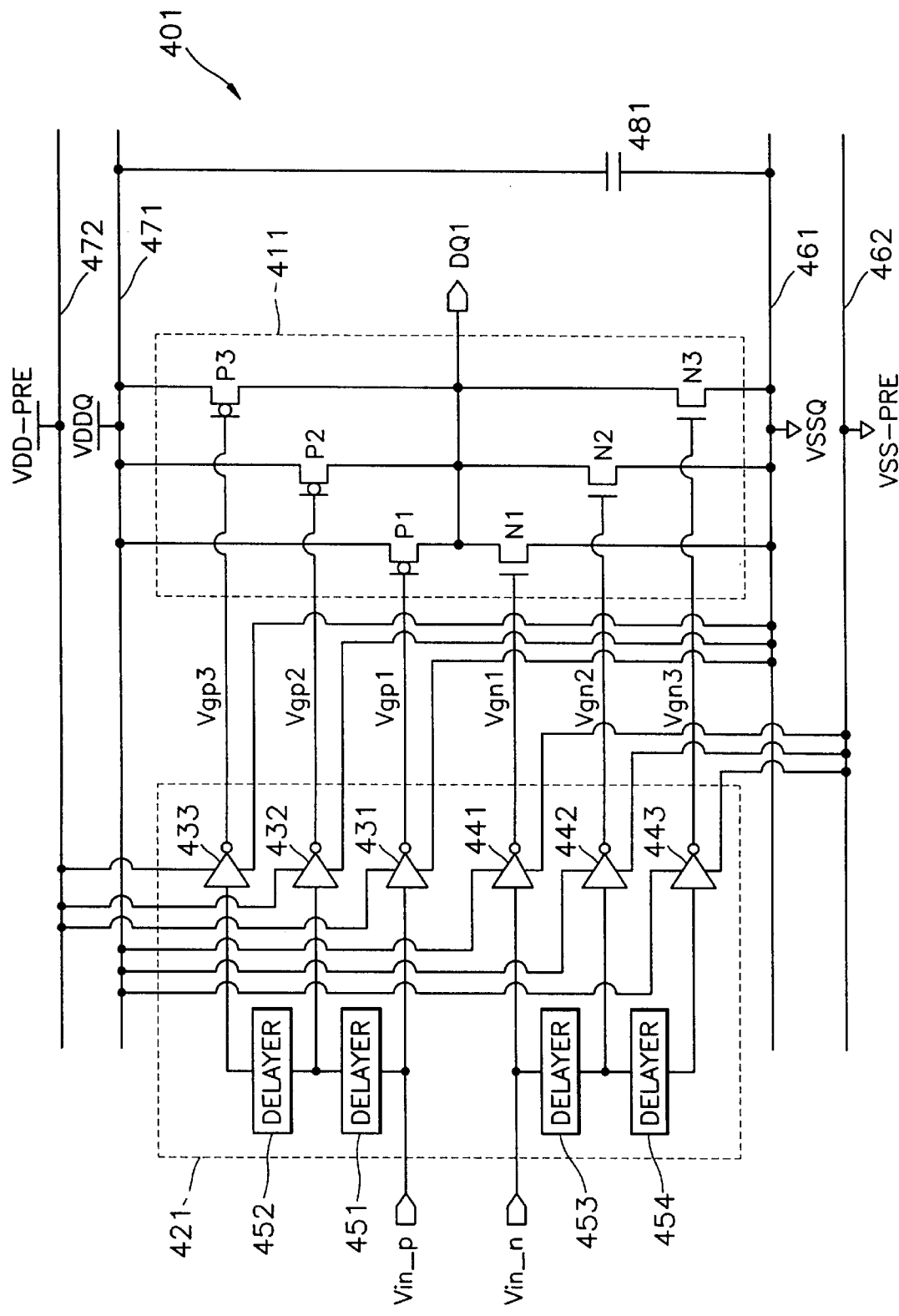
FIG. 4 is a circuit diagram of an output portion of a semiconductor device according to another illustrative embodiment of the present invention.

FIG. 4 is a circuit diagram of an output portion of a semiconductor device according to another illustrative embodiment of the present invention. Referring to FIG. 4, an output portion 401 includes an output driver 411, a pre-driver 421, and a decoupling capacitor 481. The pre-driver 421 includes first buffers 431 through 433, second buffers 441 through 443, and delayers 451 through 454.

The output driver 411 includes a plurality of PMOS transistors P1 through P3 and a plurality of NMOS transistors N1 through N3. The drains of the PMOS transistors P1 through P3 are connected to a predetermined node DQ1, and the sources of the PMOS transistors P1 through P3 are supplied with a first power voltage VDDQ via a first power line 471. Voltages Vgp1 through Vgp3 output from the first buffers 431 through 433 are applied to the gates of the PMOS transistors P1 through P3. The drains of the NMOS transistors N1 through N3 are connected to the predetermined node DQ1, and the sources of the NMOS transistors N1 through N3 are supplied with a first ground voltage VSSQ via a first ground line 461. Voltages Vgn1 through Vgn3 output from the second buffers 441 through 443 are applied to the gates of the NMOS transistors N1 through N3.

Figure 5A:
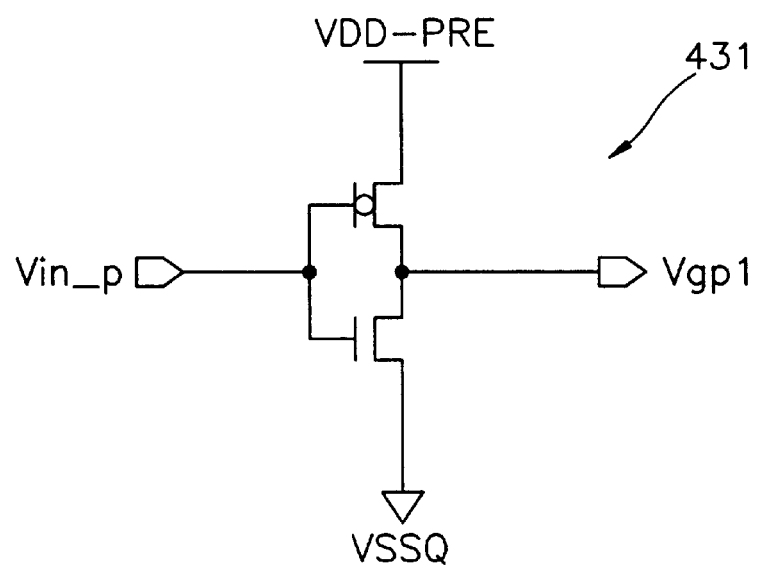
FIGS. 5A and 5B are circuit diagrams of first and second buffers shown in FIG. 4, according to an illustrative embodiment of the present invention.
Figure 5B:
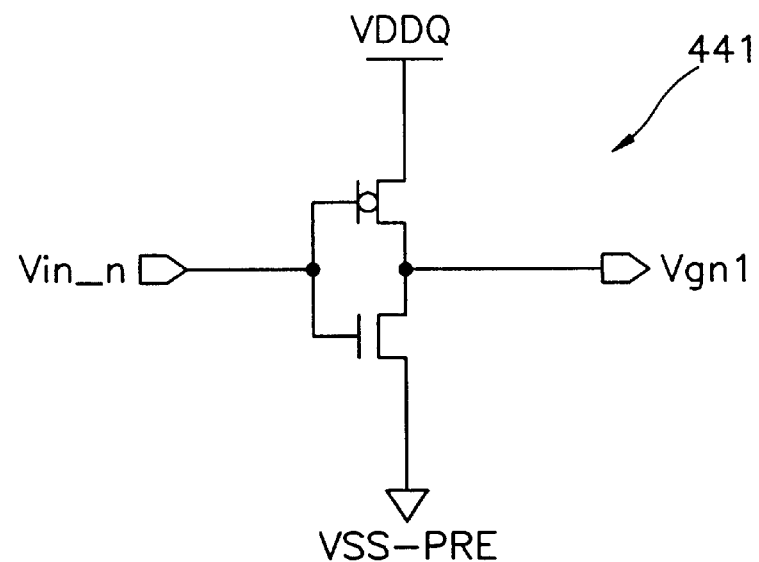

The first and second buffers 431 through 433 and 441 through 443 may include several circuits. However, as shown in FIGS. 5A and 5B, the first and second buffers 431 through 433 and 441 through 443 include inverters, and will now be described. The first buffers 431 through 433 are supplied with the first ground voltage VSSQ via the first ground line 461 and are supplied with power voltages via any one of the first power line 471 and the second power line 472. A power voltage supplied via the second power line 472 is higher or lower than the first power voltage VDDQ. The second buffers 441 through 443 are supplied with a power voltage via the first power line 471 and are supplied with a ground voltage via any one of the first ground line 461 and the second ground line 462.

Input signals Vin_p and Vin_n output from an internal circuit of the semiconductor device are applied to the first and second buffers 431 through 433 and 441 through 443. The input signal Vin_p is delayed by a predetermined amount of time by delayers 451 and 452 and then is applied to the first buffers 432 and 433. Similarly, the input signal Vin_n is delayed by a predetermined amount of time by the delayers 453 and 454 and then is applied to the second buffers 442 and 443.

The decoupling capacitor 481 is connected between the first ground line 461 and the first power line 471 and maintains the same range of fluctuation in the first ground voltage VSSQ and the first power voltage VDDQ.

The output portion 401 of FIG. 4 includes one output driver 411 and one pre-driver 421. However, in practice, a semiconductor device may include a plurality of output drivers connected to each other in parallel and a plurality of pre-drivers that are also connected to each other in parallel. Thus, the output portion 401 may simultaneously output a plurality of signals.

The operation of the output portion 401 will now be described, according to an illustrative embodiment of the present invention.

First, the input signal Vin_n is delayed by a first predetermined time by the delayer 453 and by a second predetermined time by the delayer 452. The voltage Vgn1 output from the buffer 441 is logic "high" if the input signal Vin_n is changed from logic "high" to logic "low". Then, the NMOS transistor N1 is activated, and thus the output signal DQ1 is changed to logic "low", which results in an increase in the first ground voltage VSSQ due to simultaneous switching noise. Then, the decoupling capacitor 481 increases the first power voltage VDDQ, and simultaneously, power voltages of the second buffers 441 through 443 are increased. As a result, voltages Vgn1 through Vgn3 output from the second buffers 441 through 443 are increased.

If a signal output from the delayer 453 is input into the buffer 442, then the NMOS transistor N2 is rapidly activated, thereby increasing the transition rate of the signal DQ1 output through the NMOS transistor N2. Likewise, if a signal output from the delayer 454 is input into the buffer 443, then the NMOS transistor N3 is rapidly activated, thereby increasing the transition rate of a signal DQ1 output through the NMOS transistor N3. An increase in the transition rate of the signal DQ1 output through the NMOS transistors N2 and N3 from logic "high" to logic "low" results in an increase in the transition rate of the signal DQ1.

The supply of power voltages from the first power line 471 to the second buffers 441 through 443 increases the switching rate of the NMOS transistors N1 through N3. As a result, the transition time for the output signal DQ1 to switch from logic "high" to logic "low" becomes shorter.

The input signal Vin_p is delayed by a first predetermined time by the delayer 451 and by a second predetermined time by the delayer 452. The voltage Vgp1 output from the buffer 431 is changed to logic "low" if the input signal Vin_p is changed from logic "low" to logic "high". Then, the PMOS transistor P1 is activated, and thus the output signal DQ1 is changed to logic "high". Here, the first ground voltage VSSQ is increased by simultaneous switching noise, and simultaneously, ground voltages of the buffers 431 through 433 are increased. As a result, voltages Vgp1 through Vgp3 output from the buffers 431 through 433 are also increased.

If a signal output from the delayer 451 is input into the buffer 432, then the PMOS transistor P2 is slowly activated, thereby slowing down the transition rate of a signal output through the PMOS transistor P2. Likewise, if a signal output from the delayer 452 is input into the buffer 433, then the PMOS transistor P3 is slowly activated, thereby slowing down the transition rate of the signal DQ1 output through the PMOS transistor P3. The transition rate of the signal output through the PMOS transistors P2 and P3 from logic "low" to logic "high" is slow, which results in slowing down the transition rate of the signal DQ1.

In other words, the supply of ground voltage from the first ground line 461 to the first buffers 431 through 433 slows down the switching rate of the PMOS transistors P1 through P3. As a result, the transition time for the output signal DQ1 to switch from logic "low" to logic "high" is increased.

As described above, when a large number of input signals Vin_n are changed from logic "high" to logic "low", a large number of output signals are rapidly changed from logic "high" to logic "low". When a small number of input signals Vin_p are changed from logic "low" to logic "high", a small number of output signals are slowly changed from logic "low" to logic "high". Thus, skewing of the output signals that change from logic "high" to logic "low' and the output signals that change from logic "low" to logic "high" is reduced sharply.

When a large number of input signals Vin_n are changed from logic "low" to logic "high" and a small number of input signals Vin_p are changed from logic "high" to logic "low", skewing of the output signals is also reduced sharply.

Figure 6:
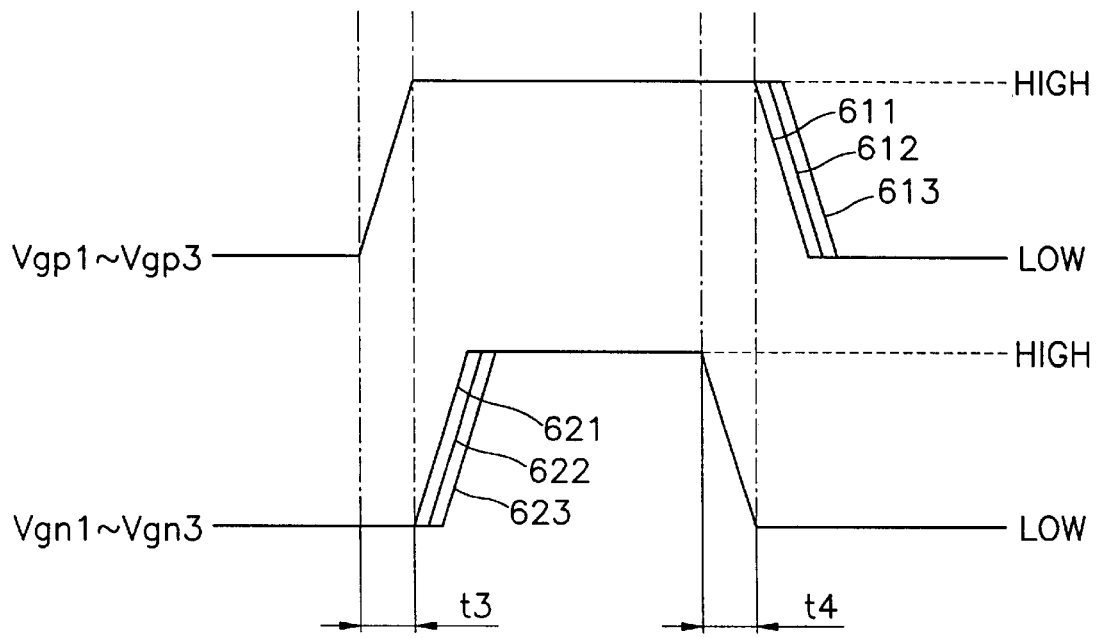
FIG. 6 is a waveform and timing diagram of signals shown in FIG. 4, according to an illustrative embodiment of the present invention.

FIG. 6 is a waveform and timing diagram of a portion of signals shown in FIG. 4, according to an illustrative embodiment of the present invention. Referring to FIG. 6, signals Vgp1 through Vgp3 are changed from logic "low" to logic "high" and after a predetermine time $t_3$, signals Vgn1 through Vgn3 are changed from logic "low" to logic "high". Thus, the PMOS transistors P1 through P3 shown in FIG. 4 are completely inactivated, and then the NMOS transistors N1 through N3 are activated, thereby increasing the transition rate of the output signal DQ1. In contrast, the signals Vgn1 through Vgn3 are changed from logic "high" to logic "low" and after a predetermined amount of time t4, the signals Vgp1 through Vgp3 are changed from logic "high" to logic "low". As a result, the NMOS transistors N1 through N3 shown in FIG. 4 are completely inactivated, and then the PMOS transistors P1 through P3 are activated, thereby increasing the transition rate of the output signal DQ1.

Falling edges 611 through 613 of the signals Vgp1 through Vgp3 are sequentially formed because the input signal Vin_p is delayed by the first and second predetermined times by the delayers 451 and 452. Likewise, rising edges 621 through 623 of the signals Vgn1 through Vgn3 are sequentially formed because the input signal Vin_n is delayed by the first and second predetermined times by the delayers 453 and 454.

Figure 7A:
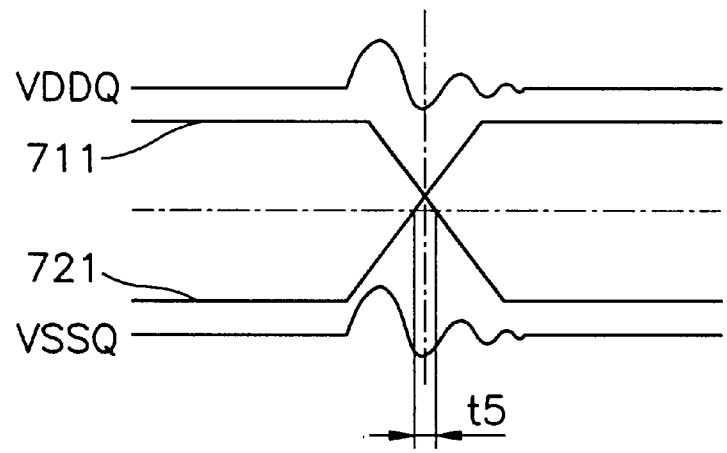
FIG. 7A is a waveform diagram of signals output when a large number of signals (from among a plurality of signals input into a plurality of pre-drivers shown in FIG. 4) are changed from logic "high" to logic "low" and a small number of signals are changed from logic "low" to logic "high", according to an illustrative embodiment of the present invention.
Figure 7B:
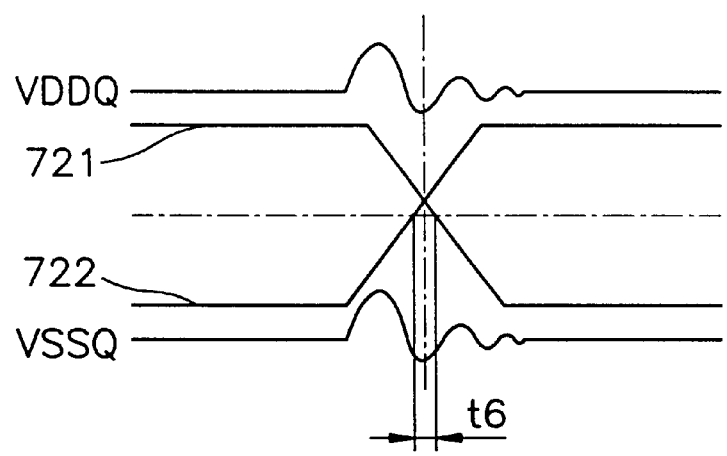
FIG. 7B is a waveform diagram of signals output when a large number of signals (from among a plurality of signals input into a plurality of pre-drivers shown in FIG. 4) are changed from logic "low" to logic "high" and a small number of signals are changed from logic "high" to logic "low", according to an illustrative embodiment of the present invention.

FIG. 7A is a waveform diagram of signals output when a large number of output signals 711 (from among a plurality of the output signals shown in FIG. 4) are changed from logic "high" to logic "low", and a small number of output signals 721 are changed from logic "low" to logic "high", according to an illustrative embodiment of the present invention. FIG. 7B is a waveform diagram of signals output when a large number of output signals 722 (from among a plurality of the signals shown in FIG. 4) are changed from logic "low" to logic "high" and a small number of output signals 721 are changed from logic "high" to logic "low".

As shown in FIGS. 7A and 7B, skewing (denoted by $t_5$ and $t_6$) of the output signals is sharply reduced. For example, a conventional skewing of the output signals is 560 psec whereas skewing of the output signals according to the present invention is half or less than half conventional skewing, e.g., about 240 psec.

As described above, the first pre-driver 331 and the first buffers 431 through 433 are supplied with ground voltages via the first ground lines 351 and 461. The second pre-driver 332 and the second buffers 441 through 443 are supplied with power voltages via the first power lines 341 and 471. Simultaneous switching noise of the output drivers 321 and 411 is induced into the pre-drivers 331, 332, and 421. As a result, skewing of the output signals is sharply reduced even though a large number of output signals are changed at the same time from a first voltage level to a second voltage level and a small number of output signals are simultaneously changed from a second voltage level to a first voltage level.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor device comprising:
   a first pre-driver for operating in response to a first signal;
   a second pre-driver for operating in response to a second signal;
   an output portion for outputting an output signal external to the semiconductor device in response to signals output from the first and second pre-drivers;
   a first ground line for supplying a first ground voltage to the output portion and the first pre-driver;
   a first power line for supplying a first power voltage to the output portion and the second pre-driver; and
   a second power line for supplying a second power voltage, wherein the first pre-driver is supplied with any one of the first power voltage or the second power voltage via the first power line or the second power line, respectively, the first power voltage being different from the second power voltage.

2. The semiconductor device of claim 1, further comprising a second ground line for supplying a second ground voltage, wherein the second pre-driver is supplied with any one of the first ground voltage or the second ground voltage via the first ground line or the second ground line, respectively, the first ground voltage being capable of having a different potential from the second ground voltage.

3. The semiconductor device of claim 1, wherein the output portion comprises:
   a PMOS transistor gated by a signal output from the first pre-driver for transmitting the a second power voltage to an output node; and
   a PMOS transistor gated by a signal output from the second pre-driver for transmitting a second ground voltage to the output node,
   wherein the output signal of the output portion is output from the output node.

4. A semiconductor device having a plurality of output portions, wherein each of the plurality of output portions comprises:
   a plurality of PMOS transistors, each of the plurality of PMOS transistors having a gate, a drain, and a source, the drain of each of the plurality of PMOS transistors being connected to a predetermined node, and the source of each of the plurality of PMOS transistors being supplied with a first power voltage;
   a plurality of first buffers, each of the plurality of first buffers being connected to the gate of each of the plurality of PMOS transistors;
   a plurality of NMOS transistors, each of the plurality of NMOS transistors having a gate, a drain, and a source, the drain of each of the plurality of NMOS transistors being connected to the predetermined node, and the source of each of the plurality of NMOS transistors being supplied with a first ground voltage; and
   a plurality of second buffers, each of the plurality of second buffers being connected to the gate of each of the plurality of NMOS transistors,
   wherein the plurality of first buffers are supplied with the first ground voltage, the plurality of second buffers are supplied with the first power voltage, and a signal output from a previous portion of the semiconductor device is input into the first and second buffers at predetermined time intervals.

5. The semiconductor device of claim 4, wherein each of the first buffers have a ground terminal connected to a line transmitting the first ground voltage.

6. The semiconductor device of claim 4, wherein each of the second buffers have a power terminal connected to a line transmitting the first power voltage.

7. The semiconductor device of claim 4, wherein the plurality of PMOS transistors are first inactivated and then the plurality of NMOS transistors are activated when the signal output from the previous portion of the semiconductor device changes from a logic low level to a logic high level.

8. The semiconductor device of claim 4, wherein the plurality of NMOS transistors are first inactivated and then the plurality of PMOS transistors are activated when the signal output from the previous portion of the semiconductor device changes from a logic high level to a logic low level.

9. The semiconductor device of claim 4, further comprising a decoupling capacitor connected to the line transmitting the power voltage and the line transmitting ground voltage to maintain a uniform range of fluctuations in the power voltage and the ground voltage during the switching of the output portion.

10. A semiconductor device comprising:
    a first pre-driver for operating in response to a first signal;
    a second pre-driver for operating in response to a second signal;
    an output portion for outputting an output signal external to the semiconductor device in response to signals output from the first and second pre-drivers;
    a first ground line for supplying a first ground voltage to the output portion;
    a second ground line for supplying a second ground voltage;
    a first power line for supplying a first power voltage to the output portion and the second pre-driver; and
    a second power line for supplying a second power voltage,
    wherein the first pre-driver is supplied with any one of the first power voltage or the second power voltage via the first power line or the second power line, respectively, the first power voltage being different from the second power voltage, the second pre-driver is supplied with any one of the first ground voltage or the second ground voltage via the first ground line or the second ground line, respectively, the first ground voltage being capable of having a different potential from the second ground voltage.

11. The semiconductor device of claim 10, wherein the output portion comprises:
    a PMOS transistor gated by a signal output from the first pre-driver for transmitting a second power voltage to an output node; and
    a PMOS transistor gated by a signal output from the second pre-driver for transmitting the a second ground voltage to the output node, wherein the output signal of the output portion is output from the output node.

12. The semiconductor device of claim 10, further comprising a decoupling capacitor connected between the first power line and the first ground line to maintain a uniform range of fluctuations in the first power voltage and the first ground voltage during switching of the output portion.

13. A semiconductor device comprising:

a first pre-driver for operating in response to a first signal;

a second pre-driver for operating in response to a second signal;

an output portion for outputting an output signal external to the semiconductor device in response to signals output from the first and second pre-drivers;

a first ground line for supplying a first ground voltage to the output portion and the first pre-driver;

a first power line for supplying a first power voltage to the output portion and the second pre-driver;

a second power line for supplying a second power voltage, wherein the first pre-driver is supplied with any one of the first power voltage or the second power voltage via the first power line or the second power line, respectively, the first power voltage being different from the second power voltage; and a decoupling capacitor connected between the first power line and the first ground line to maintain a uniform range of fluctuations in the first power voltage and the first ground voltage during switching of the output portion.

14. The semiconductor device of claim 13, further comprising a second power line for supplying a second power voltage, wherein the first pre-driver is supplied with any one of the first power voltage or the second power voltage via the first power line or the second power line, respectively, the first power voltage being different from the second power voltage.

15. The semiconductor device of claim 13, further comprising a second ground line for supplying a second ground voltage, wherein the second pre-driver is supplied with any one of the first ground voltage or the second ground voltage via the first ground line or the second ground line, respectively, the first ground voltage being different from the second ground voltage.

16. The semiconductor device of claim 13, wherein the output portion comprises:

a PMOS transistor gated by a signal output from the first pre-driver for transmitting the second power voltage to an output node; and a PMOS transistor gated by a signal output from the second pre-driver for transmitting the second ground voltage to the output node, wherein the output signal of the output portion is output from the output node.

17. A semiconductor device comprising:

a first pre-driver for operating in response to a first signal;

a second pre-driver for operating in response to a second signal;

an output portion for outputting an output signal external to the semiconductor device in response to signals output from the first and second pre-drivers;

a first ground line for supplying a first ground voltage to the output portion and the first pre-driver;

a first power line for supplying a first power voltage to the output portion and the second pre-driver; and a second ground line for supplying a second ground voltage, wherein the second pre-driver is supplied with any one of the first ground voltage or the second ground voltage via the first ground line or the second ground line, respectively, the first ground voltage being capable of having a different potential from the second ground voltage.

* * * * *